US006462641B1

(12) United States Patent
Dieny et al.

(10) Patent No.: US 6,462,641 B1
(45) Date of Patent: Oct. 8, 2002

(54) MAGNETORESISTOR WITH TUNNEL EFFECT AND MAGNETIC SENSOR USING SAME

(75) Inventors: Bernard Dieny, Lans en Vercors; Laurence Giacomoni, Cachan, both of (FR); Anatoly Vedyaev, Moscou (RU)

(73) Assignee: Commissariat A L'Energie Atomique, Paris (FR)

( * ) Notice: Subject to any disclaimer, the term of this patent is extended or adjusted under 35 U.S.C. 154(b) by 0 days.

(21) Appl. No.: 09/601,722

(22) PCT Filed: Feb. 10, 1999

(86) PCT No.: PCT/FR99/00289

§ 371 (c)(1),
(2), (4) Date: Oct. 23, 2000

(87) PCT Pub. No.: WO99/41792

PCT Pub. Date: Aug. 19, 1999

(30) Foreign Application Priority Data

Feb. 11, 1998 (FR) ............................................. 98 01616

(51) Int. Cl.$^7$ ............................................. H01L 43/00
(52) U.S. Cl. ................... 338/32 R; 360/324.1
(58) Field of Search ....................... 338/32 R; 360/324.1

(56) References Cited

U.S. PATENT DOCUMENTS

| | | | |
|---|---|---|---|
| 3,947,889 A | * 3/1976 | Lazzari | 360/113 |
| 4,949,039 A | 8/1990 | Grunberg | |
| 5,712,612 A | * 1/1998 | Lee et al. | 338/32 R |
| 6,077,618 A | * 6/2000 | Sakakima et al. | 428/693 |
| 6,111,729 A | * 8/2000 | Kamiguchi et al. | 360/324.1 |
| 6,124,711 A | * 9/2000 | Tanaka et al. | 324/252 |
| 6,205,008 B1 | * 3/2001 | Gijs et al. | 360/324 |

OTHER PUBLICATIONS

A. Fert and P. Bruno, "2.2 Interlayer Coupling and Magnetoresistance in Multilayers", Magnetic Coupling and Magnetoresistance (No date supplied).

J.C. Slonczewski, "Conductance and Exchange Coupling of Two Ferromagnets Separated by a Tunneling Barrier", The American Physical Society, Apr. 1, 1998, vol. 39, No. 10.

J. Nowak and J. Rauluskiewicz, "Spin Dependent Electron Tunneling Between Ferromagnetic Films", Journal of Magnetism and Magnetic Materials 109 (1992) 79–90.

J.S. Moodera, lisa R. Kinder, Terrilyn M. Wong and R. Meservey, "Large Magnetoresistance at Room Temperature in Ferromagnetic Thin Film Tunnel Junctions", The American Physical Society, Apr. 17, 1995, vol. 74, No. 16.

T. Miyazaki & N. Tezuka, "Giant Magnetic Tunneling Effect in Fe/Al$_2$O$_3$/Fe Junction", Journal of Magnetism and Magnetic Materials 139 (1995) L231–L234.

Jagadeesh S. Moodera and Lisa R. Kinder, "Ferromagnetic –Insulator–Ferromagnetic Tunneling: Spin–Dependent Tunneling and Large Magnetoresistance in Trilayer Junctions (invited)", J. Appl. Phys. 79 (8). Apr. 15, 1996.

A. Veryayev, N. Ryzhanova, C. Lacroix, L. Giacomoni and B. Dieny, "Resonance in Tunneling Through Magnetic Valve Tunnel Junctions", Europhys. Lett., 39 (2), pp. 219–224 (1997).

P. Bruno, "Interlayer Exchange Coupling: A Unified Physical Picture", Journal of Magnetism and Magnetic Materials 121 (1993) 248–252.

* cited by examiner

*Primary Examiner*—Karl D. Easthom
(74) *Attorney, Agent, or Firm*—Pearne & Gordon LLP

(57) ABSTRACT

Tunnel effect magnetoresistance comprising, in the form of a stack:
- a first layer (12) of free magnetisation magnetic material,
- a "barrier" layer (16), composed of an electrically insulating material, and
- a second layer (14) of trapped magnetisation magnetic material, According to the invention, the thickness of the first layer (12) of magnetic material is less than 10 nm.

The invention may be particularly applied to the manufacture of magnetic data read heads.

10 Claims, 2 Drawing Sheets

MAGNETORESISTOR WITH TUNNEL EFFECT AND MAGNETIC SENSOR USING SAME

FIELD OF THE INVENTION

The present invention relates to a tunnel effect magnetoresistance, also known as a "magnetic valve" magnetoresistance, and a magnetic sensor using such a magnetoresistance.

Magnetic sensors are sensitive to magnetic fields or fluxes. In this way, the magnetic sensor according to the invention may be used, for example, to read data recorded on magnetic data storage media. In addition, the invention may be used to produce Magnetic Random Access Memory devices.

The magnetic sensor may also be used to determine an electric current flowing in a wire, by measuring the magnetic field applied in the vicinity of said wire.

Finally, other applications of the magnetic sensor, such as a position sensor or a magnetoresistive compass, may also be envisaged.

More generally, the invention relates to any type of sensor or magnetoresistance capable of detecting or measuring magnetic fields, particularly weak fields, i.e. ranging from a few A/m to a few thousand A/m.

STATE OF THE PRIOR ART

Until recently, the magnetoresistive sensors used to detect weak magnetic fields, particularly in the field of magnetic recording, were mostly sensors based on a "magnetoresistance anisotropism" effect.

The magnetoresistance anisotropism effect can be seen in ferromagnetic transition metals such as nickel, cobalt or iron-based alloys. It consists of a variation of the resistivity of the magnetic material as a function of an angle between an electric measurement current flowing through the material and the magnetisation of the material.

The relative change in resistivity $\rho$ of the magnetic material, referred to as $\Delta\rho/\rho$, may reach 4 to 5% at room temperature for fields of the order of 1 kA/m, and in solid ferromagnetic transition metals. However, this amplitude is reduced to 1 to 2% when the same materials are deposited in thin layers with thicknesses of 15 to 30 nanometer. This range of thicknesses is that used to manufacture current magnetoresistive sensors. Therefore, the sensitivity of these sensors is limited. In addition, their response is not linear. Indeed, the variation in the resistivity is proportional to the square of the cosine of the angle between the measurement current and the magnetisation.

Sensors operating according to a "giant magnetoresistance" effect are also known. This effect was first discovered for iron-chromium type multilayer structures and subsequently for other multilayer systems formed by alternating layers of ferromagnetic transition metal and layers of non-magnetic metal.

In these systems, the magnetoresistance effect is essentially linked to a change in the relative orientation of the magnetisations of the successive ferromagnetic layers. This effect is usually referred to using the terms "giant magnetoresistance" or "spin-valve effect".

In spin-valve type magneto resistances, the sensitive ferromagnetic layer, i.e. the free magnetisation layer, has a thickness between 6 and 12 nm to obtain a maximum magnetoresistance amplitude. Below 6 nm, said magnetoresistances have a response amplitude that decreases considerably. Therefore, this type of magnetoresistance is limited in terms of sensitivity for low flux quantities.

Document 1, the reference of which is given at the end of the present disclosure, gives a very general description of the use of said giant magnetoresistance effect to produce magnetic field sensors.

Finally, it is known that there is a magnetoresistance effect in metal-insulating material-metal tunnel effect junctions wherein a thin layer of insulating material, forming a potential barrier for conduction electrons, is inserted between two layers of magnetic metal.

The magnetic metal is selected, for example, from Fe, Co, Ni or their alloys and the layer of the insulating material, a few nanometer thick, is composed of a material selected, for example, from $Al_2O_3$, MgO, AlN, $Ta_2O_5$, $HfO_2$, NiO.

In this type of junction, when electrons are forced to pass through the barrier by means of a tunnel effect, by connecting the junction to a current source or by applying a voltage between the two layers of magnetic metal, it is observed that the conductance G of the junction varies as a function of the relative orientation of the magnetisations of the layers of magnetic material at either side of the barrier formed by the insulating material (in the manner of an optical polariser-analyser system).

This effect, called the "magnetic valve effect", was first observed only at low temperatures and its amplitude was very low.

However, specific magnetic material/insulating material/magnetic material type structures with $Fe/Al/Al_2O_3/FeCo$ type junctions have made it possible to obtain variations in conductance, at room temperature, with an amplitude of the order of 17%.

Magnetic valve effect structures are described, for example, in documents 2, 3 and 4. Similarly, experiments on tunnel effect junctions are described in documents 5 and 6. The references of these documents are given at the end of the present disclosure.

Recently, considerable progress was made in the development of junctions, particularly in relation to the quality control of the insulating barrier.

The insulating barrier is produced, for example, by depositing a thin layer of aluminium on one of the metal electrodes of the junction and then oxidising the aluminium layer with oxygen plasma.

The oxygen plasma oxidation time thus makes it possible to check the thickness and, therefore, the electrical resistance of the insulating barrier.

It is also possible to allow the layer of aluminium to oxidise in air. In this case, the results and the quality of the insulating barrier are less reproducible.

In magnetic valve effect junctions with a magnetic material-oxide-magnetic material type structure, designated M—O—M', the magnetic materials are selected such that the magnetisation of one of the magnetic layers (e.g. M'a) remains fixed in a given direction, in the range of fields to be measured, while the magnetisation of the other layer (M in this example) is capable of following the variations of the field applied. The first layer is called the "trapped layer" while the second is called the "sensitive layer". The benefit of magnetic valve junctions in relation to spin-valve structures is that they offer wider measurement amplitudes (17% instead of 5 to 9%).

DESCRIPTION OF THE INVENTION

The invention relates to a tunnel effect magnetoresistance as described above offering a wider conductance variation amplitude.

The invention also relates to magnetoresistances with an increased sensitivity and offering a more compact size.

The invention also relates to a magnetic sensor, particularly for ultra-high density magnetic recording (greater than 10 Gbit/inch$^2$), making it possible to read data using very small quantities of magnetic flux.

To achieve these objectives, the present invention more specifically relates to a tunnel effect magnetoresistance comprising, in the form of a stack:

a first layer of free magnetisation magnetic material, a "barrier" layer, composed of an electrically insulating material, and a second layer of trapped magnetisation magnetic material.

According to the invention, the thickness of the first layer of magnetic material is less than or equal to 7 nm.

A particularly good magnetoresistance sensitivity may be obtained when the thickness of the first layer of magnetic material is between 0.2 nm and 2 nm.

Thanks to the extreme thinness of the first layer of magnetic material in particular, the magnetoresistance shows wide-amplitude conductance variations for low variation values of the magnetic flux applied.

Such a magnetoresistance is thus suitable for reading data on data media, such as hard disks, with a high data density. Indeed, the greater the density of data stored on a hard disk, the lower the quantity of magnetic flux $\phi$ produced by the magnetic transitions between two adjacent data bits, picked up by a read head, is. This magnetic flux induces a rotation $\Delta\theta$ of the magnetisation of the sensitive magnetic layer given by $\phi \approx LL \cdot E_{Em} \cdot \Delta\theta$. In this expression, Le represents the cross-section of the sensitive magnetic layer wherein the magnetic flux $\phi$ enters, e is the thickness of said sensitive layer and Ms is its spontaneous magnetisation. The above expression implies that, at an equal quantity of flux $\phi$, the lower the thickness e of the sensitive layer, the greater the rotation $\Delta\theta$ of its magnetisation is.

The conductance $G(\Delta\theta)$ of the junction varies according to the formula:

$$G(\Delta\theta) = G_{antiparallel} + (G_{parallel} - G_{antiparallel})\left(\frac{1 + \cos(\Delta\theta)}{2}\right)$$

In this formula, $P_{arallel}$ and $A_{ntiparallel}$ represent the conductances in the parallel and anti-parallel configurations, respectively. It appears that the higher $\Delta\theta$ is, the greater the conductance variation is and, therefore, the greater the sensitivity of the sensor is.

To compare with known conventional structures, it should be pointed out that, in metal magnetoresistive sensors based on the magnetoresistance anisotropism effect, or AMR, the thickness of the sensitive layer is at least 15 nm. In such sensors, it is not possible to reduce the thickness of the sensitive layer significantly. Indeed, in AMR sensors, the amplitude of the conductance variation effect falls significantly when the thickness of the sensitive layer is less than 20 nm. In the same way, the electrodes used in tunnel effect junctions, as described in documents 5 and 6, for example, have considerable thicknesses, greater than 30 nm.

According to a particular aspect of the invention, the second magnetic layer, with trapped magnetisation, may be produced with a thickness comparable to that of the first magnetic layer. For example, its thickness is between 0.4 and 2 nm.

When the second magnetic layer is thin, the magnetostatic interactions between the second layer, in which the magnetisation is trapped, and the first layer, in which the magnetisation is free, are low. In this way, the first magnetic layer is not influenced and retains its free magnetisation property better, even in very small magnetoresistance structures.

According to another aspect of the invention, the magnetoresistance may also comprise a layer of non-ferromagnetic metal NM between the first layer of magnetic material M and the insulating barrier O. The purpose of this layer NM is to form an anti-reflection coating for only one category of conduction electrons (or the spin electrons parallel to the magnetisation of the layer M, or the spin electrons anti-parallel to the magnetisation of M). This results in a high increase in the effective polarisation of the electrons passing through the insulating barrier by means of a tunnel effect and thus a greater magnetoresistance amplitude. This effect is described from a theoretical point of view in document 7. The physical origin of this spin-dependent anti-reflection effect is the same as that giving rise to magnetic coupling oscillations through the non-ferromagnetic layers observed in multilayer structures of a period M/NM when the thickness of the layers NM varies. It lies in the fact that the electron reflection coefficients at the N/NM interfaces depend on the electron spin in relation to the magnetisation of the layer M. For more information on this subject, it is possible to refer to documents 8 and 9 listed at the end of the present disclosure. Consequently, to benefit from this selective spin anti-reflection effect in the tunnel junctions according to the invention, it is necessary to select the magnetic metal/non-ferromagnetic metal pair such that the corresponding multilayers of the period M/NM show coupling oscillations as a function of the thickness of the layers NM. Considerable literature is currently available on these coupling oscillation multilayers (e.g. see document 8). This literature may be used as a database for selecting the materials M/NM. A particularly appropriate choice for tunnel junctions consists of using a magnetic metal layer made of Co or Co-rich $Co_{1-x}Fe_x$ alloys (x between 0 and 50%) and a layer of Cu for the non-ferromagnetic layer. Indeed, Co/Cu multilayers are known to show significant coupling oscillations through Cu. Other examples of possible choices of N, NM pairs are (Fe, Cr), (Co, Ru) and (Fe, Au). The thickness of the layer NM may vary from 0 to approximately 10 nm and preferably from 0.04 to 3 nm.

These anti-reflection layers NM may advantageously be inserted at either side of the insulating barrier O between the magnetic layers and the insulating barrier.

The magnetoresistance may also comprise at least one layer of magnetic material, or doping layer, inserted at the interface between the magnetic layer M and the layer NM or, failing a layer NM, between M and the insulating barrier O.

The doping layers are very thin layers making it possible to increase the polarisation of the electrons passing through the barrier layer by means of the tunnel effect.

They may be composed of cobalt, iron or a $Co_{1-x}Fe_x$ alloy, where x is a parameter between 0 and 1. If required, the doping layers may contain low quantities of other elements, such as nickel.

The invention also relates to a magnetic sensor, for example for reading data, comprising one or more magnetoresistances as described above.

The invention's other characteristics and advantages will be seen more clearly in the following description, with reference to the appended figures. This description is given solely for illustration purposes and is not exhaustive.

DETAILED DESCRIPTION OF EMBODIMENTS OF THE INVENTION

Figure 1:
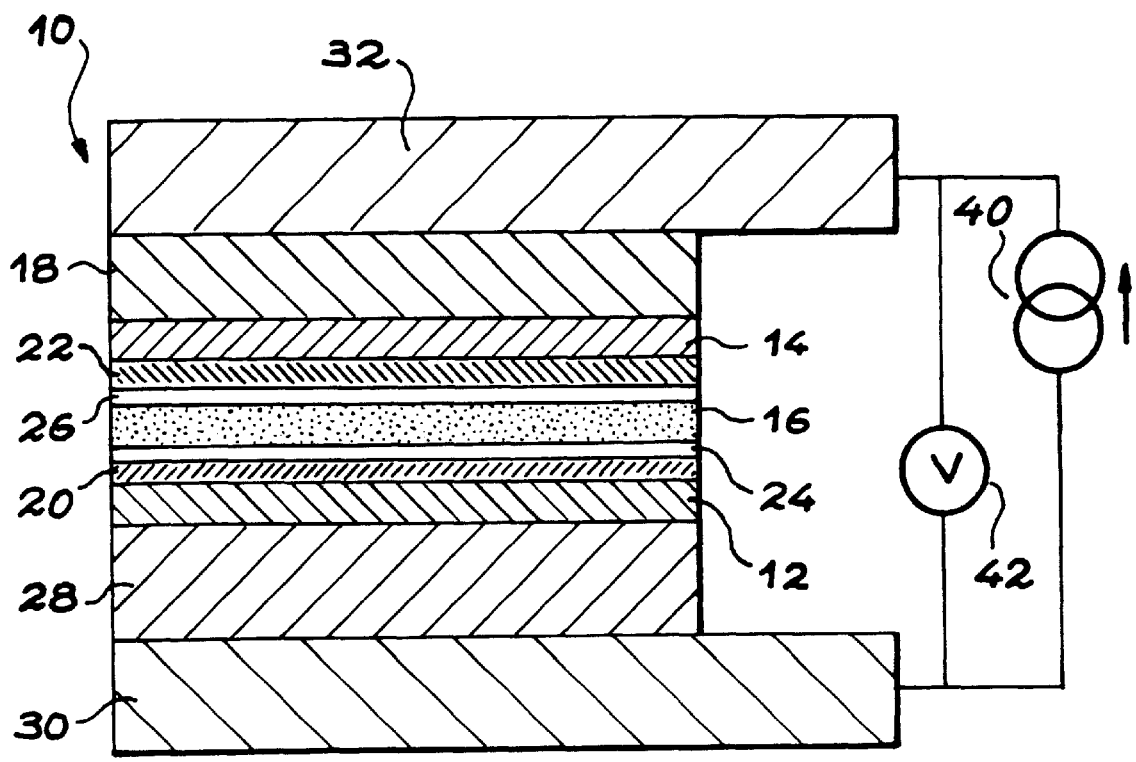
FIG. 1 is a schematic section of a magnetoresistance according to the present invention.

Before describing FIG. 1, it is necessary to specify that this figure is not a representation to scale of a magnetoresistance according to the invention. Indeed, for the sake of clarity, the thickness of some sections is exaggerated.

The magnetoresistance 10 in FIG. 1 essentially comprises a first layer of free magnetisation magnetic material 12, a second layer of trapped magnetisation magnetic material 14 and a "barrier" layer 16 composed of an electrically insulating material, which separates the first and second layer of magnetic material.

The first layer of magnetic material 12 is the sensitive magnetoresistance layer. It is composed of a magnetically mild material, such as Permalloy. In this way, its magnetisation responds easily to the variations of an applied external magnetic field.

According to the invention, this layer is very thin such that its magnetisation can rotate significantly under the effect of weak magnetic fluxes. The thickness of the first magnetic layer 12 is, as specified above, preferably selected between 0.2 and 2 mm.

The second layer of magnetic material 14 comprises trapped magnetisation, e.g. by means of exchange anisotropism with an anti-ferromagnetic layer, preferably metallic.

In the example in FIG. 1, the second layer of magnetic material is in contact and coupled with a trapping layer 18 made of an anti-ferromagnetic alloy. The materials that can be used to produce the trapping layer include the following alloys: FeMn, IrMn, CrMn, CrPtMn, IrCrMn, PtMn, NaMn.

The magnetic material of the second layer 14 may be selected from Fe, Co, Ni and $Fe_{1-x-y}Co_xNi_y$ alloys, preferably rich in Fe or Co (y between 0 and 30%, x between 0 and 100%).

In addition, the second layer 14 is produced preferentially with a thickness between 0.4 and 2 nm.

Producing a thin second layer 14 offers the advantage of promoting the trapping of the magnetisation by exchange anisotropism (coupling with the anti-ferromagnetic layer 18). Indeed, the magnetic trapping field is an inverse function of the thickness of the trapped layer. In this way, a thin layer will have a greater trapping field than a thicker layer.

Another advantage related to the thinness of the second magnetic layer 14 is that a leakage field, liable to exist between the edges of said layer, is reduced.

The reduction of said leakage field makes it possible to avoid parasitic magnetostatic coupling between the first and second layers and thus retain the magnetically mild nature of the first layer 12 of magnetic material even in a device with reduced lateral dimensions (of the order of one micron).

The barrier layer 16 is a thin layer of electrically insulating material such as alumina. Its thickness is preferably between 0.5 nm and a few nanometer. The barrier layer may be obtained by oxidising a layer of aluminium with oxygen plasma.

Reference 20 designates a thin layer composed of a material such as Fe, Co or a Co—Fe alloy, which is inserted between the first layer 12 of magnetic material and the barrier layer 16. This thin layer 20, also referred to as the doping layer, makes it possible to increase the polarisation of the electrons passing through the barrier layer by means of the tunnel effect. The thickness of the doping layer 20 is preferably between 0.1 and 0.4 nm.

Another doping layer 22, equivalent to the doping layer 20, mentioned above, is also provided between the second layer of magnetic material 14 and the barrier layer.

Reference 24 in FIG. 1 designates a non-ferromagnetic metal layer, such as a layer of Cu, inserted between the doping layer 20 of the first layer 12 of magnetic material and the insulating barrier layer 16. The thickness of the non-ferromagnetic layer can vary from 0 to a few nanometer. It acts as a selective spin anti-reflection layer as described above. Another layer 26, equivalent to the non-ferromagnetic layer 24, may be advantageously inserted between the insulating barrier layer 16 and the doping layer 22.

A first conductive layer 30 and a second conductive layer 32 are provided to supply a measurement current to the terminals of the magnetoresistance. These conductive layers are in electrical contact with the first and second layers of magnetic material, respectively.

The first layer of magnetic material 12 is connected to the first conductive current supply layer 30 by means of one (or more) electrically conductive buffer layer(s) 28. For example, the buffer layer may be selected from Ti, V, Cr, Co, Nb, Ru, Ta and W. The buffer layer's role is related to the production of the magnetoresistance since it is intended to promote the satisfactory growth of the other layers of the magnetoresistance.

The thickness of the buffer layer 28 is of the order of one to a few nanometers. This thickness is preferably low so as not to increase the total thickness of the magnetoresistance and thus not increase the distance between the magnetic poles (terminals) of the magnetoresistance. This is particularly advantageous for obtaining magnetic track read heads with a good linear resolution.

The second conductive current supply layer 32 is connected to the second layer 14 of magnetic material by means of the trapping layer 18.

When the magnetoresistance is intended to be used as a sensor in a magnetic track read head, the magnetic screens generally present in "vertical" heads well known to specialists, may be advantageously used as conductive current supply layers 30, 32. Said screens are often composed of Permalloy or CoZrB alloys.

References 40 and 42 designate a current generator and a current variation measurement device, respectively. These devices are fitted between the current supply layers 30, 32.

The current generator 40 is used to circulate a measurement current approximately perpendicular to the stack of layers through the magnetoresistance. In addition, the measurement device 42 is used to record the voltage variations at the terminals of the magnetoresistive element, on the basis of the conductance of the magnetoresistance, in response to the variations of a detected external magnetic field.

FIG. 1 only represents one specific embodiment of a magnetoresistance according to the invention. Other embodiments may be envisaged. For example, the order of layers could also be as follows: current supply layer, buffer layer, anti-ferromagnetic magnetisation trapping layer, thin trapped magnetisation magnetic layer, doping layer, anti-reflection layer, insulating barrier, anti-reflection layer, doping layer, free magnetisation magnetic layer, current supply layer.

In these structures, some layers, such as the doping layers, anti-reflection layers or buffer layers, for example, are not essential. In the same way, the magnetisation of the second magnetic layer may be trapped without using a layer of anti-ferromagnetic trapping material.

For example, the second coat of magnetic material may be a permanent magnet type highly coercive layer or a layer of alloy with a composition similar to $Co_{50}Fe_{50}$.

Other trapping processes used in spin-valve type structures may also be selected. For example, the second layer of trapped magnetisation magnetic material may be formed from two Co—Ru—Co type anti-ferromagnetic coupling magnetic layers, the thickness of said layers being 1 nm, 0.4 nm and 1 nm, for example.

Figure 2:
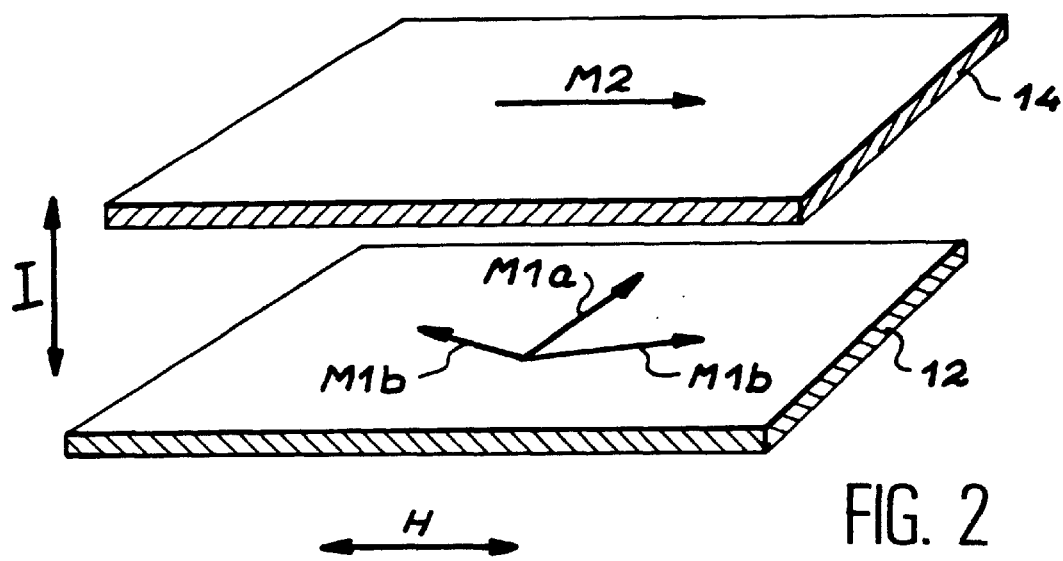
FIG. 2 is a schematic representation of the magnetisation orientations of the magnetic layers of the magnetoresistance in FIG. 1.

In FIG. 2, only the first and second layer of magnetic material 12, 14 are shown. I designates the measurement current circulating by means of the tunnel effect through the insulating barrier between the layers of magnetic material. This current is represented by a double arrow. In the same way, a double arrow represents an external field H applied to the magnetoresistance.

The trapped magnetisation of the second layer 14 of magnetic material is indicated by an arrow $M_2$. In the example shown, the magnetoresistance is oriented such that the trapped magnetisation $M_2$ is approximately parallel to the external field H.

The magnetisation of the first layer 12 of mild magnetic material is free.

An arrow $M_{1a}$ indicates the orientation of the magnetisation of the first layer 12 in the absence of an applied external field. This orientation corresponds to a free magnetisation axis of the layer of magnetically mild material.

By design, the first and second layers of magnetic material are arranged such that the free magnetisation axis of the first layer 12 of magnetic material is approximately perpendicular to the magnetisation trapping direction of the second layer 14 of magnetic material.

When the magnetic field H is applied to the magnetoresistance, the magnetisation of the first magnetic layer 12 changes orientation. The magnetisation of said layer is aligned in a direction parallel or anti-parallel to the magnetisation of the second magnetic layer 14 when the magnetic field applied reaches a saturation value.

The magnetisation of the first magnetic layer in the presence of the field H is indicated with arrows $M_{1b}$. If the external field is applied along $M_2$, the magnetisations $M_{1b}$ and $M_2$ tend to become parallel. If the external field is applied in the opposite direction of $M_2$, the magnetisations $M_{1b}$ and $M_2$ become anti-parallel.

Figure 3:
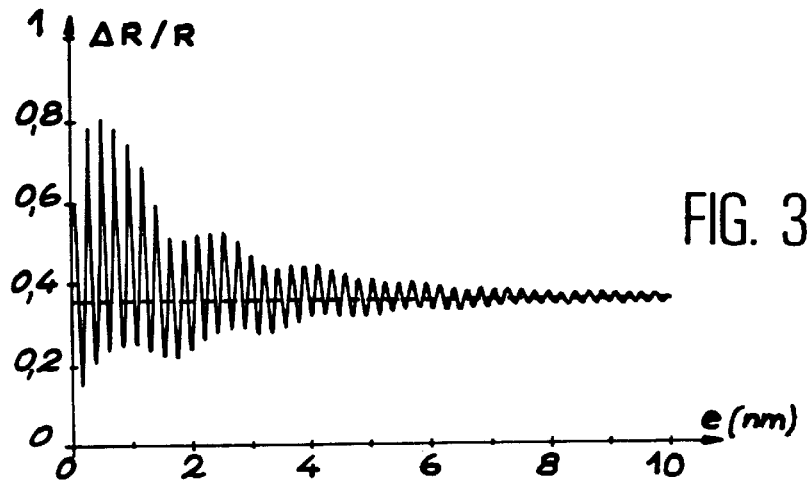
FIGS. 3, 4 and 5 are graphs indicating the magnetoresistance response amplitude as a function of the thickness of a free magnetisation magnetic layer of the magnetoresistance.
Figure 4:
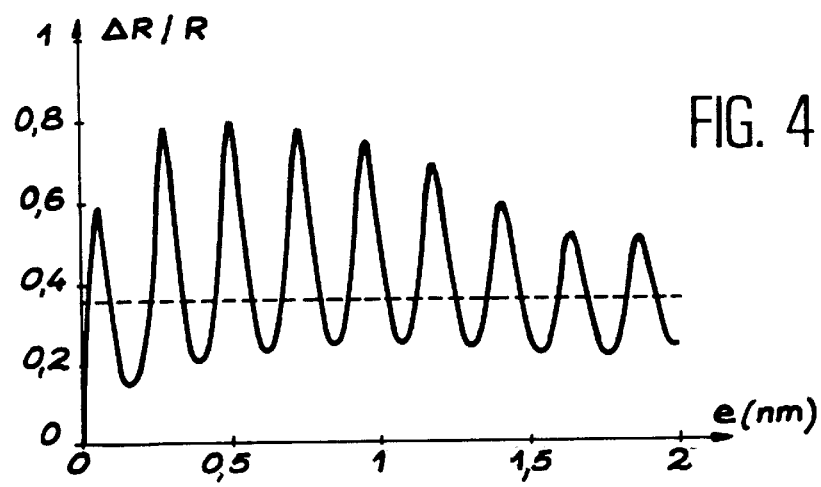
Figure 5:
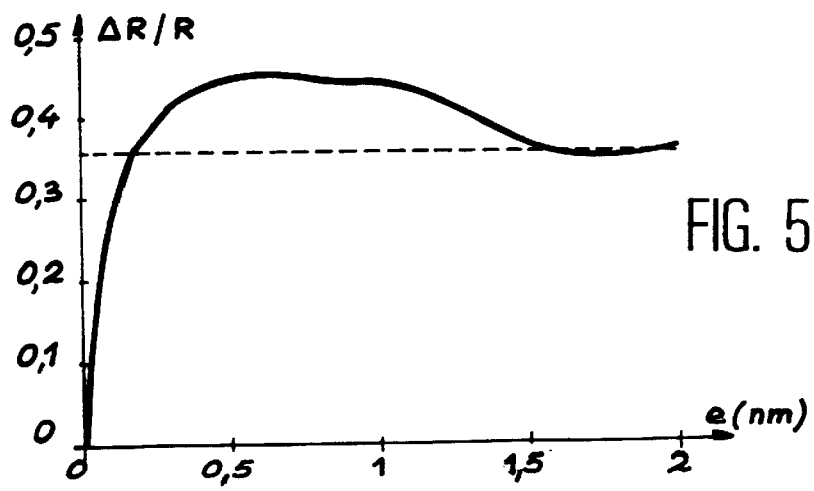

FIGS. 3, 4 and 5 are graphs expressing, on the Y-axis, the relative variation of the conductance $\Delta R/R$ as a function of the thickness of the layers of magnetic material 12. This thickness is given in nanometers.

These graphs are drawn up by calculating for a magnetoresistance according to the invention with the following structure: one layer of non-magnetic (semi-infinite) metal, one layer of magnetic material, one layer of oxide barrier, one layer of magnetic material and one layer of non-magnetic (semi-infinite) metal.

Where k refers to the Fermi level wave vectors of the materials used and ↑ and ↓ refers to the electron spin, the parameters to draw up the graphs are as follows:

for the non-magnetic layers: $k\uparrow = k\downarrow = 1$ Å$^{-1}$,
for the magnetic layers: $k\uparrow = 0.2$ Å$^{-1}$, $k\downarrow = 1.4$ Å$^{-1}$
for the insulating oxide barrier: $k\uparrow = k\downarrow = 1i$ Å$^{-1}$, The wave vectors are real in the metals and imaginary in the insulating material (damped wave). The parameter values selected for the magnetic layers correspond to a 42% tunnel electron polarisation. This polarisation is very similar to that measured in iron (40%).

FIG. 3 represents the magnetoresistance variation of the junction when the thickness of the magnetic layers 12 varies between 0 and 10 nm. The dotted line corresponds to the asymptotic value of the magnetoresistance obtained when the thickness of the magnetic layers tends to infinity.

It can be seen in this figure that the maximum amplitude is obtained for layers 12 less than 2 nm thick. This amplitude decreases progressively to reach an asymptotic value for a thickness of the order of 7 nm. Therefore, according to the invention, the first magnetic layer 12 is selected with a thickness less than or equal to 7 nm.

FIG. 4 is an enlarged view of FIG. 3 for a magnetic layer thickness varying between 0 and 2 nm. The oscillations are due to quantum interference effects linked to reflections occurring at the non-magnetic metal-magnetic metal and magnetic metal-insulating oxide barrier interfaces.

These interference effects may disappear in real junctions showing a certain roughness at the interfaces between the layers.

FIG. 5 shows the magnetoresistance variations as a function of the thickness of the magnetic layers, accounting for a roughness of 0.2 nm at the non-magnetic metal/magnetic metal and magnetic metal/ oxide interfaces. This roughness results in spatial fluctuations in the thickness of the magnetic layers, which filters the quantum oscillations in FIG. 4, so as to retain only the mean variation. However, the major point is that very thin magnetic layers are sufficient to produce the magnetoresistance effect in said magnetic junctions.

The curves are calculated according to a theoretical model explained in document 7, the reference of which is given below.

In this way, the magnetoresistances according to the invention make it possible, by decreasing the thickness of the free magnetisation layer, to obtain higher magnetoresistance sensitivities with reference to conventional magnetoresistances for a given magnetic flux.

REFERENCE DOCUMENTS (1) U.S. Pat. No. 4 949 039
(2) PHYSICAL REVIEW B, vol. 39, No. 10, Apr. 1, 1989, "Conductance and exchange coupling of two ferromagnets separated by a tunneling barrier" by J. C. Slonczewski
(3) Journal of Magnetism and Magnetic Materials 109 (1992) 79–90, "Spin dependent electron tunneling between ferromagnetic films" by J. Nowak and J. Rauluszkiewics
(4) PHYSICAL REVIEW LETTERS, vol. 74, No. 16, Apr. 17, 1995 "Large magnetoresistance at Room Temperature in Ferromagnetic Thin Film Tunnel Junctions" by J. S. Moodera et al.
(5) Journal of Magnetism and Magnetic Materials 139 (1995) L231–L234 "Giant magnetic tunneling effect in Fe/$Al_2O_3$/Fe junction" by T. Miyazaki, N. Tezuka et al.
(6) J. Appl. Phys. 79(8), Apr. 15, 1996, Symposium on Spin Tunneling and Injection Phenomena "Ferromagnetic-insulator-ferromagnetic tunneling: Spin-dependent tunneling and large magnetoresistance in trilayer junctions" by Jagadeesh S. Moodera and Lisa R. Kinder
(7) Europhysics Letters, Europhys. Lett. 39(2), pp. 219–224 (1997), Jul. 15, 1997 "Resonance in tunneling through magnetic valve tunnel junctions" by A. Vedyayev et al.

(8) Eds B. Heinrich and J. A. C. Bland (Springer-Verlag Berlin 1994, 82) "Ultrathin Magnetic Structures II, Measurement Techniques and Magnetic Properties", A. Fert and P. Bruno, (1994)

(9) Journ. Magn. Mater. 121, 248 (1993) "Interlayer exchange coupling: a unified physical picture", P. Bruno

What is claimed is:

1. Tunnel effect magnetoresistance comprising, in the form of a stack:

a first layer (12) of free magnetisation magnetic material, a "barrier" layer (16), composed of an electrically insulating material, a second layer (14) of trapped magnetisation magnetic material, and a layer (24) of non-ferromagnetic metal inserted between the first layer of magnetic material and the insulating barrier layer, characterized in that the thickness of the first layer (12) of magnetic material is less than or equal to 7 nm.

2. Magnetoresistance according to claim 1, wherein the thickness of the first layer (12) of magnetic material is between 0.2 nm and 2 nm.

3. Magnetoresistance according to claim 1, wherein the thickness of the second layer (14) of magnetic material is between 0.4 nm and 2 nm.

4. Magnetoresistance according to claim 1, also comprising at least one doping layer of magnetic material (20, 22) in contact with at least one of the first and second layers of magnetic material, respectively.

5. Magnetoresistance according to claim 1, wherein the doping layer (20, 22) is a layer composed of a $Co_{1-x}Fe_x$ alloy, where $0 \leq x \leq 1$.

6. Magnetoresistance according to claim 1, also comprising a layer of anti-ferromagnetic material (18) in contact with the second layer of magnetic material (14) to trap the magnetisation of said second layer.

7. Magnetoresistance according to claim 1, also comprising two current supply layers (30, 32) in electrical contact with the first (12) and second (14) layers of magnetic material, respectively.

8. Magnetoresistance according to claim 7, also comprising at least one metal buffer layer (26) between the first layer of magnetic material (12) and the current supply layer (30) in electrical contact with said first layer.

9. Magnetic sensor comprising at least one magnetoresistance according to any of the preceding claims.

10. Tunnel effect magnetoresistance comprising, in the form of a stack:

a first layer (12) of free magnetisation magnetic material, a "barrier" layer (16), composed of an electrically insulating material, a second layer (14) of trapped magnetisation magnetic material, and a layer (26) of non-ferromagnetic metal inserted between the insulating barrier layer and the second layer of magnetic material, characterized in that the thickness of the first layer (12) of magnetic material is less than or equal to 7 nm.

* * * * *